United States Patent [19]
Fantechi

[11] 4,084,173
[45] Apr. 11, 1978

[54] INTERDIGITATED TRANSISTOR PAIR

[75] Inventor: Roberto Luigi Fantechi, Sugar Land, Tex.

[73] Assignee: Texas Instruments Incorporated, Dallas, Tex.

[21] Appl. No.: 708,239

[22] Filed: Jul. 23, 1976

[51] Int. Cl.² ............... H01L 27/02; H01L 29/78
[52] U.S. Cl. ............................ 357/42; 357/41; 357/44; 357/46; 357/23
[58] Field of Search ............... 357/42, 44, 46, 41, 357/23

[56] References Cited
U.S. PATENT DOCUMENTS

| 3,665,423 | 5/1972 | Nakanuma et al. | 357/41 |
| 3,813,586 | 5/1974 | Conner | 357/41 |

Primary Examiner—Edward J. Wojciechowicz
Attorney, Agent, or Firm—Rene' E. Grossman; James T. Comfort; Richard P. Berg

[57] ABSTRACT

A pair of field effect transistors are arranged with interdigitated electrodes to reduce the voltage offset which can otherwise arise when the pair are operated as a differential amplifier. The interdigitated electrodes are arranged as essentially parallel elongated regions in a semiconductive substrate, certain regions serving as a first electrode for one of the field effect transistors, other regions serving as a first electrode for the other field effect transistor and still other regions serving as a common second electrode for both field effect transistors.

15 Claims, 21 Drawing Figures

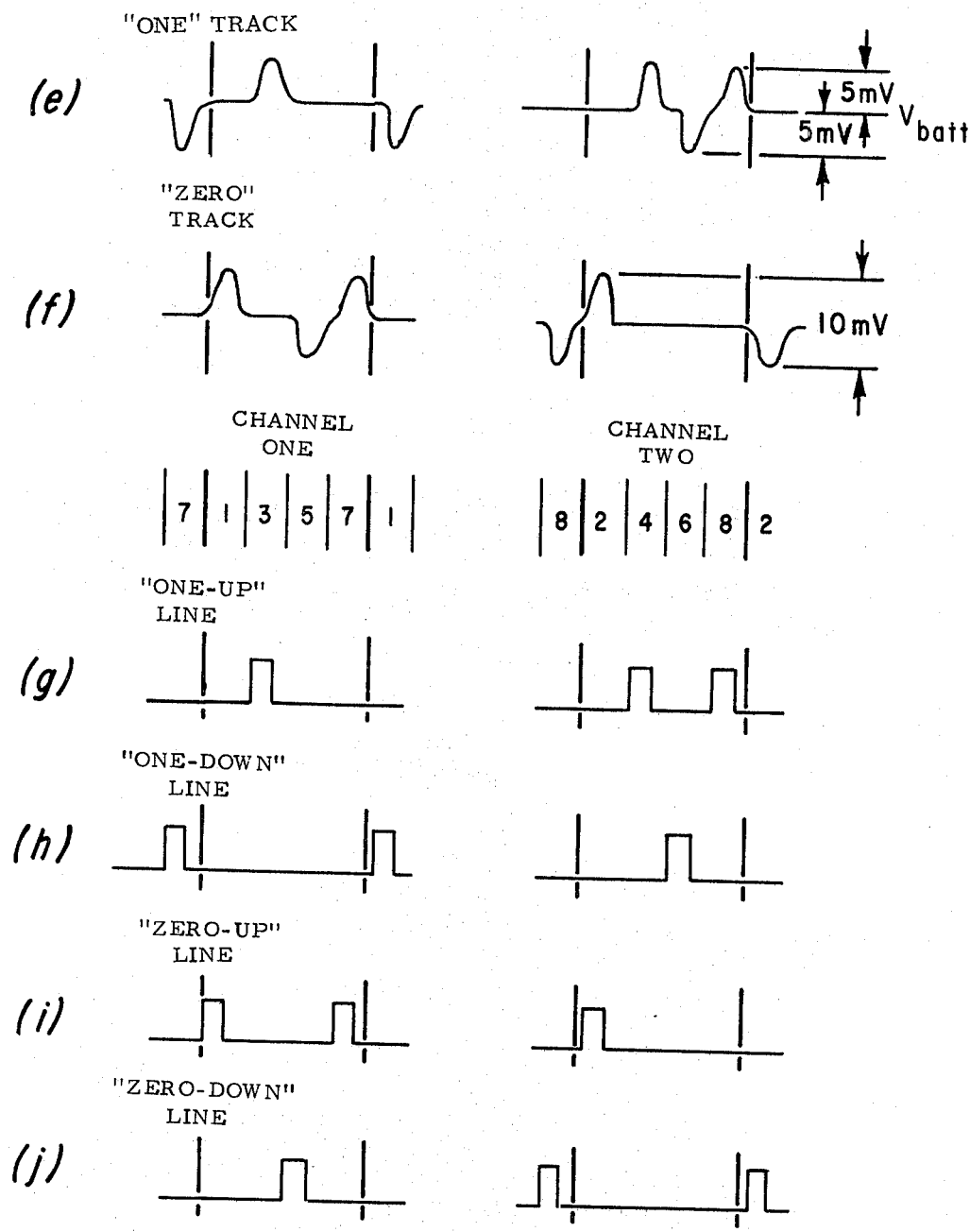
Fig. 5 (con't.)

INTERDIGITATED TRANSISTOR PAIR

BACKGROUND OF THE INVENTION

The present invention relates to a complementary transistor pair and more particularly to a complementary field effect transistor (FET) pair having interdigitated electrodes. The disclosed complementary pair may be used as part of a differential amplifier in a low level amplifier implemented with field effect transistors, for instance. When used as a differential pair, the disclosed complementary pair is relatively immune to offset voltages caused either by temperature differentials or process variations.

Conventionally, low level amplifiers, e.g., amplifiers responding to input signals having a magnitude on the order of 5 millivolts, have been implemented with conventional bipolar transistors; however, amplifiers utilizing discrete field effect transistors (FET's) are also known in the prior art. FET's exhibit relatively wide parametric variation; for instance, their threshold voltage ($V_t$) may vary between $-1.3$ and $-2.3$ volts or more. Since discrete FET's may be typed according to the measured characteristics of the FET as manufactured, by appropriately selecting the type of FET used in a discrete amplifier, the problems associated with FET parametric variation are largely accounted for.

In the disclosed amplifier using the disclosed interdigitated complementary pair, however, the amplifier is used as part of a predominantly digital FET MOS chip of the type preferably used in an electronic calculator. The amplifier is used in the chip to step up low level signals (approximately 10 mv peak to peak) received from a magnetic card reading coil to more normal logic levels. This amplifier typically occupies only a small portion of the chip on which a great majority of the transistors are used in digital logic circuits. The wide parametric variation associated with field effect transistors which causes the threshold voltage ($V_t$) to vary between $-1.3$ to $-2.3$ volts DC does not appreciably effect digital circuits having logic levels on the order of several volts. However, it should be evident that such a change in threshold voltage would normally significantly effect the operation of a low level amplifier. Since it is not practical to use discrete FET's to implement an amplifier in an electronic calculator or to discard chips because they exhibit an unacceptably high or unacceptably low threshold voltage, a low level amplifier using the interdigitated FET pair which is relatively insensitive to variations in FET threshold voltages eliminates the waste associated with discarding chips having high or low threshold voltages or the expense associated with using discrete devices to implement a low level amplifier in an electronic calculator.

It is, therefore, an object of this invention to improve low level FET amplifiers.

It is yet another object of this invention to reduce the senstivity of low level FET amplifiers to variations in FET threshold voltage.

It is still yet another object of this invention to reduce the sensitivity of a complementary pair differential amplifier to temperature and manufacturing defects.

It is another object of this invention to reduce the offset voltage of a complementary pair FET differential amplifier.

The foregoing objects are achieved according to the present invention as is now described. In a preferred embodiment of the invention, two input field effect transistors are arranged as a differential pair, the sources of which are connected in common to the drain of a third field effect transistor. The source of the third field effect transistor is connected to the circuit common. The outputs from the input field effect transistors are coupled to gates of output field effect transistors, whose sources are resistively coupled to the circuit common, preferably with a fourth field effect transistor. The source of the output field effect transistors are coupled back to the gate of the third field effect transistor, thereby providing a feedback circuit which desensitizes the amplifier to relatively wide variations in field effect transistor threshold voltage characteristics. The amplifier is preferably coupled to a pair of level detecting circuits each of which drive a latch for providing normal digital logic level output signals in response to low level signals received at the amplifier input. The pairs of latches and level detecting circuits are arranged to detect whether the input signals vary positively or negatively from a normal bias level.

The differential pair is arranged with interdigitated electrodes, the interdigitated electrodes being essentially parallel elongated regions of one conductivity type in a semiconductive substrate of intrinsic or opposite conductivity type. Every other such region preferably serves as a common drain for the pair. The regions between the drain region alternatingly serve as separate source regions for the transistors of the pair. A layer of insulation overlies the substrate and gate electrodes are formed over the substrate between the various regions, the gate electrodes preferably extending over the source regions and between neighboring drain regions.

DETAILED DESCRIPTION

Figure 1:
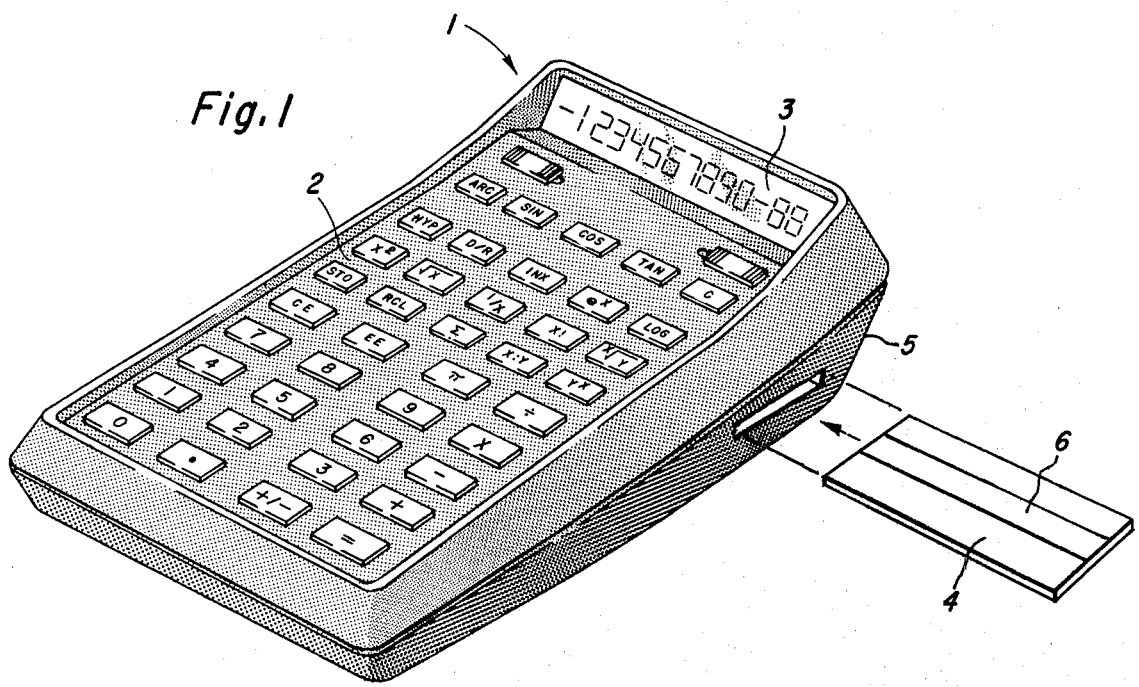
FIG. 1 depicts a programmable hand-held calculator of the type which may embody the present invention.
Figure 2:
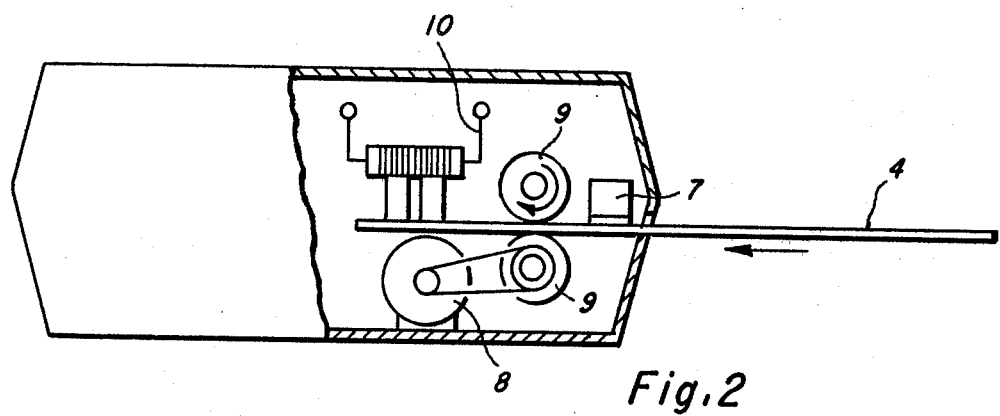
FIG. 2 is a cross sectional view through the programmable hand-held calculator shown in FIG. 1, the cross section being taken through the card reading mechanism.

In FIG. 1 is depected a programmable hand-held calculator of a type which may embody the invention. Referring now to FIG. 1, the calculator is contained within a small, pocket sized, housing 1 of molded plastic or the like and includes a keyboard 2 of the type having 10 decimal number keys, 0–9, along with a decimal point key and a large number of function keys including basic arithmetic (+, −, ×, ÷) functions along with trigonometric, logarithmic, exponential functions and others, as is typical for a scientific calculator, for example. A display 3 is provided, usually in a form of a segmented light emitting diode (LED), liquid crystal, or vacuum fluorescent type device. Usually eight or ten mantissa digits, plus two digits for exponents, plus an anotator digit for both mantissa and exponent, are provided in the display. The calculator is programmed either by a sequence of keystrokes or by use of the magnetic card reader circuitry of the invention, by magnetic card 4 which is inserted in a slot 5 in the side of the calculator housing 1. The card 4 has a stripe 6 of ferro magnetic material thereon to contain the recorded program (typically a similar strip is also on the opposite side of the card so that the card may be run through the calculator twice for programs which have a larger number of steps). The steps of the program are recorded on the strip 6 in binary form by reversals in polarity of magnetization. As is seen in FIG. 2, when the card 4 is inserted in the slot 5, it engages a detector 7 which senses the presence of the card and, assuming the calculator is in the proper operating condition, actuates a small electric motor 8 which drives a pair of rollers 9 which engage the card 4 and drive it through the length of the slot 5, pass a group of reader/writer coils 10 aligned with strip 6 and out the other side of the calculator. For sake of clarity, only one of the reader/writer coils 10 is depicted in FIG. 2.

Figure 3A:
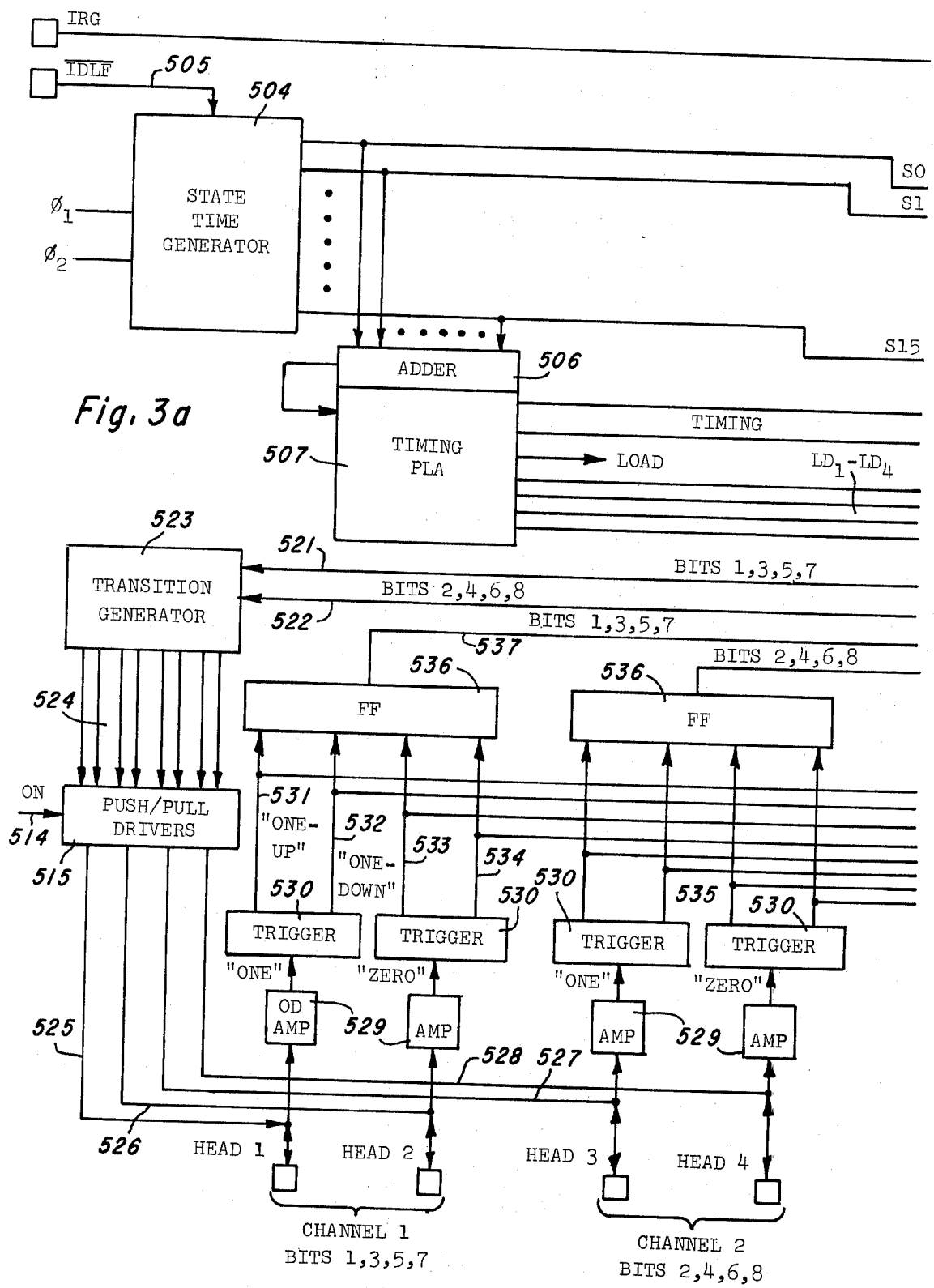
FIGS. 3a and 3b show in block diagram form the magnetic card read/writer electronic calculator chip embodying the present invention.
Figure 3B:
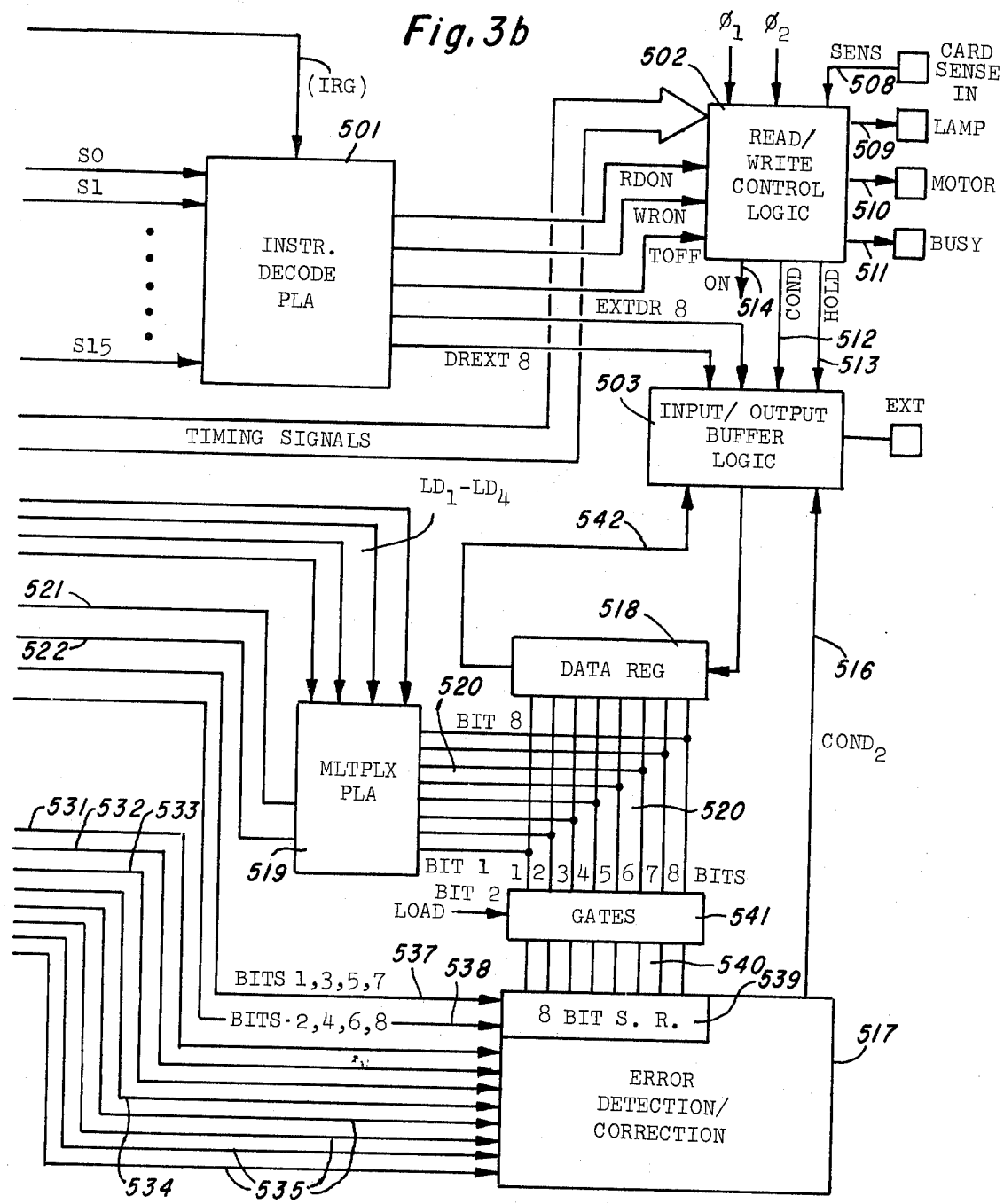
Figure 4:
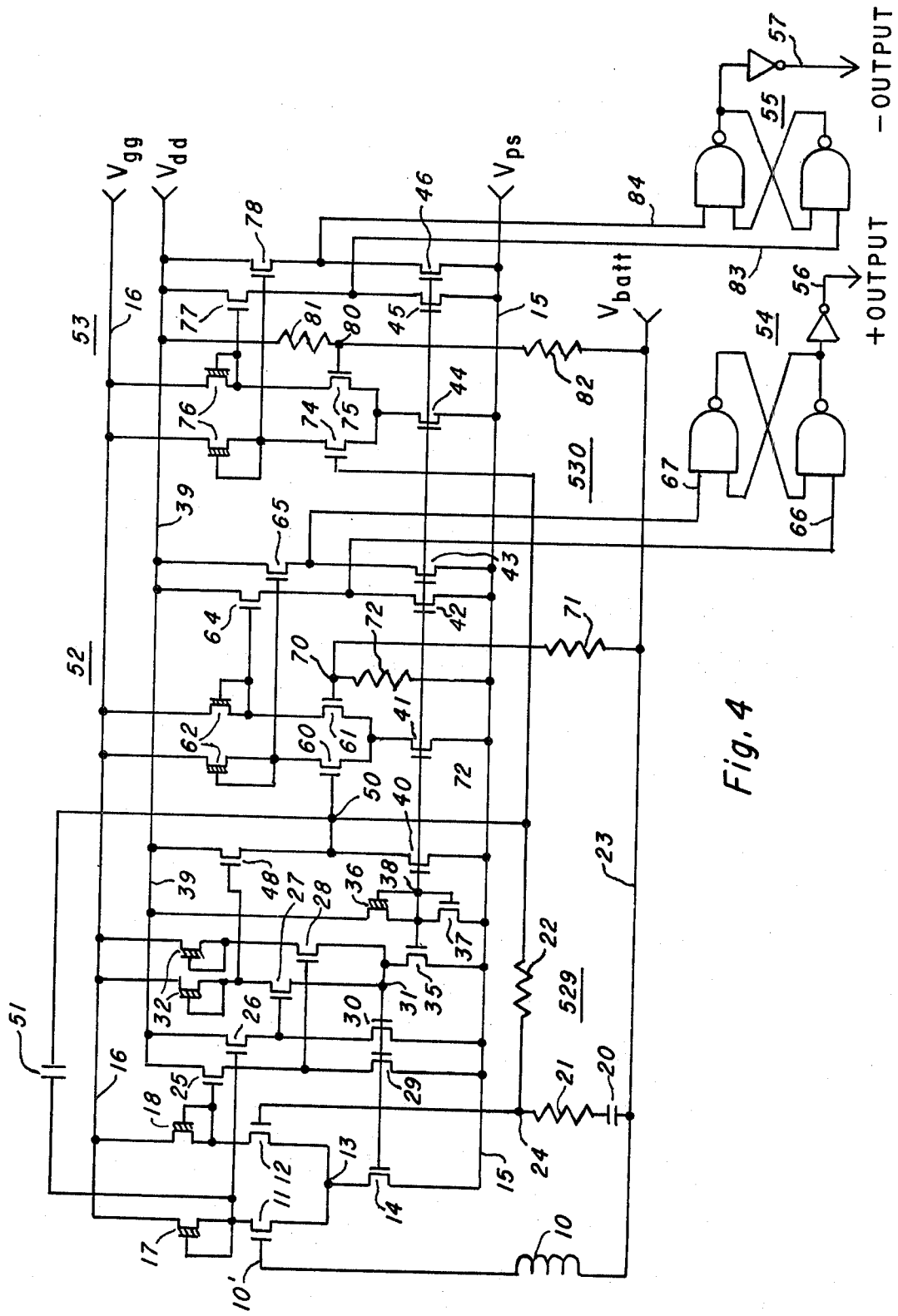
FIG. 4 is a detailed schematic diagram of the amplifier.

FIGS. 3a and 3b are functional block diagrams of a MOS magnetic card reader/writer chip for a programmable calculator embodying the present invention. FIG. 4 is a detailed schematic diagram of the operational amplifier/level detector and latch circuits depicted in FIGS. 3a–3b; circuit elements are designated in standard contemporary symbology well known in the art. Connected to the card reader/writer chip are magnetic card reader/writer coils 10 (FIG. 2) disposed in a single four track head for magnetically storing information on the magnetic card and retrieving information from such a magnetic card. This type of head is well known in the art and will not be described in detail here. Furthermore, it is understood that the card reader/writer chip is coupled to a programmable calculator system preferably of the type described in U.S. patent application Ser. No. 622,280 filed Oct. 10, 1975 and signals are transmitted between the reader/writer chip and the rest of the calculator system. While U.S. patent application Ser. No. 622,280 describes a desk model scientific calculator, the design thereof may be reduced in order to package the system in a hand-held calculator of the type shown in FIG. 1. Card reader/writer chip is connected to the calculator system by an EXT line and receives a timing sync signal $\overline{IDLE}$ and internal instruction words (IRG). The card reader/writer chip also produces a BUSY signal which is supplied to the calculator system to indicate that the chip is currently engaged in reading or writing and is not ready to accept (or provide) additional data.

Control of the card reader/writer chip is accomplished in the following manner. The calculator system's internal instruction word (IRG) is applied to instruction decode PLA 501 where it is decoded to produce control signals to control logic 502 and buffer logic 503. The state times for the chip are produced in the state time generator 504 and are synchronized with the calculator system by the application of the synching signal $\overline{IDLE}$. The state generator 504 supplies sixteen state times, $S_0$–$S_{15}$, to instruction decode PLA 501 and adder 506 (which is associated with the timing PLA 507.)

In response to timing signals, control signals (from instruction decode PLA 501), and the card sense signal (SENS, supplied on line 508 by the magnetic card reading/writing mechanism), read/write control logic 502 produces control signals to input/output buffer logic 503 and to the card reading/writing mechanism (FIG. 2).

The SENS signal provided by the card handling mechanism on line 508 to control logic 502 indicates the status of the card reader/writer mechanism. This signal serves two functions. Initially it indicates the physical presence of a card; then the condition of the card, i.e., protected or unprotected. This input and those provided by instruction decode PLA 501 enable the control logic to produce control signals to external devices on lines 509–511 and to internal circuits on lines 512–514.

Line 509 supplies a voltage when needed to power the detector 7 (which may be a lamp used in conjunction with a phototransistor, for example) which is used to determine whether a card is present in the mechanism. Similarly line 510 supplies power, as required, to the motor which propels the magnetic card past the read/write heads of the mechanism. As described above, the control logic produces a BUSY signal when unable to accept (or produce) data. In addition to these external signals, a number of control signals are produced which are inputs to various circuits within the card reader/writer chip. Two of these signals, $COND_1$ and HOLD, are applied on lines 512 and 513 to input/output buffer logic 503 to aid in controlling the transmission and reception of data (program step words) on the EXT line. The $COND_1$ signal on line 512 is produced by control logic 502 to indicate that the writing mechanism is disabled because the particular card currently in that mechanism is a "protected" card, i.e., is a card on which information has previously been permanently stored and which has been designated as "protected" so that no further information is written over that which is already stored. The HOLD signal on line 513 is supplied to buffer logic 503 in order to set the HOLD bit in EXT which instructs the calculator system to provide additional time, as has been previously described, for card reader/writer executions. The ON signal produced on line 514 is supplied to push/pull drivers 515 in order to turn on the buffers within the driver circuits when "writing" is to be performed.

Input/output buffer logic 503 provides control of the data flow (program step words) on the EXT line. In addition to the inputs from control logic 502, decoded instruction signals, EXTDR8 (*EXT* line to *D*ata *R*egister, 8 bits) and DREXT8 (*D*ata *R*egister to *EXT* line, 8 bits) are provided by instruction decode PLA 501.

The $COND_2$ signal on line 516, when set, indicates that the error detection and correction circuit 517 has detected two errors in sequence on a single track as it is being read from a magnetic card. In accordance with the present invention, as will be hereinafter described in detail, the error detection and correction circuit is capable of detecting and correcting an error in a sequence of data on any particular track. Where two or more errors are detected in sequence on one track, the particular circuit of the present embodiment which utilizes two tracks/channel is incapable of making a correction. When such error condition exists, the $COND_2$ signal on line 516 is set, causing buffer logic 503 to set the COND bit in the EXT data word. The system continues to operate until the entire card is read. The calculator system then tests the COND bit and, upon finding the COND bit set, causes an indication of the error condition to be displayed to the user of the calculator as, for example, by flashing the display on and off.

When the card reader/writer chip is in the "write card" mode, as determined by the calculator system's current internal instruction word (IRG), a sequence of program step words is being serially applied to the chip on the EXT line (from a keyboard register of the calculator's arithmetic chip). This sequence of program step words originates from program storage (via the keyboard register and EXT line). Controlled by buffer logic 503, the eight bits of a user program step instruction word are serially shifted onto an eight bit data register 518. Data register 518 has serial inputs and outputs as well as parallel inputs and outputs. In the "write card" mode, the contents of data register 518 are supplied, in parallel fashion, to multiplex PLA 519 on lines 520. With the input of timed sequential loading signals, $LD_1$-$LD_4$, bits 1, 3, 5, 7 and bits 2, 4, 6, 8 are output from multiplex PLA 519 on lines 521 and 522, respectively. The bits are shifted out of the multiplex PLA 519 one after another on lines 521 and 522 to transition generator 523.

The scheme used herein for storing information on a magnetic card is well known in the art and will only be briefly described here. Generally, an NRZ (non-returning to zero) code is used in which, for each channel, two tracks are provided. One of these tracks is used solely for storing "ones"; the other stores only "zeros". Two channels are shown in the present embodiment which allows more information to be written on a single magnetic card than would be the case with a single channel. For each of these channels of data bits, each "one" causes a flux transition (alternating negative to positive and positive to negative) to occur on the "one's" track and each "zero" causes a transition (alternating negative to positive and positive to negative) to occur on the "zero's" track. No flux change occurs on the "one" track for a "zero" bit, and no flux change occurs on the "zero" track for a "one" bit. The device within the card reader/writer chip which produces the proper signals for implementing this method of information storage is transition generator 523. Receiving bits 1, 3, 5, 7 (channel one) on line 521 and bits 2, 4, 6, 8 (channel two) on lines 522, transistion generator 523 converts the two data streams (which are in standard binary form) into signals which implement the NRZ code. These signals, supplied on lines 524 to push/pull drivers 515, are used to selectively control the heads of the magnetic reading/writing mechanism. Push/pull drivers 515 are enabled only when the ON signal is present on line 514. As previously described, this signal is supplied by control logic 502 only when the reading/writing mechanism is ready to accept and store information on a magnetic card. Lines 525-528 from push/pull drivers 515 drive the four tracks. Note that line 525 and line 526 are respectively the "one" and "zero" lines of channel one, supplying $head_1$ ("one" head) and $head_2$ ("zero" head). Lines 527 and 528 supply the "one" and "zero" heads of channel two which operates to store bit transitions simultaneously with channel one. Thus, at least one bit is written on one of the tracks of each channel during each period, which during the reading mode makes it readily apparent when a bit is missing in one of the channels as will hereinafter be described in detail.

As an example of the write operation, refer to the graphic representation of FIG. 5a, in which an exemplary eight bit user program step instruction word is shown in binary form. As multiplexed by multiplex PLA 519, the four bit signals of each of channel one and channel two, corresponding to such exemplary user program step instruction word, are shown in FIG. 5b as they appear (in binary form) on lines 521 and 522. FIGS. 5c and 5d depict the corresponding "one" and "zero" flux transistions produced by the magnetic heads in response to transition signals provided by the transition generator 523.

In FIGS. 3a and 3b, the card reader/writer chip enters the "read card" mode upon command from the calculator system, as determined by decoding the calculator's internal instruction word (IRG). Of course, information stored on a prerecorded card which is to be read is stored in the NRZ code, and the mechanism which allows reading of the card uses the same four track magnetic head to read the two tracks of each of the two channels of the card. The detector and the motor used to propel the magnetic card are powered, as hereinabove described, by read/write control logic 502. A signal (SENS) indicating the presence of a card in the mechanism, is provided on line 508 to control logic 502. The proper signals to enable input/output buffer logic 502 are supplied from both the control logic 502 and the instruction decode PLA 501. In particular, DREXT8 (Data Register to EXT line, 8 bits) is applied to enable buffer logic 503 to output serially, on the EXT line, the contents of the data register 518. This signal, obtained by decoding the instruction word (IRG), indicates that the calculator system is ready to accept, on the EXT line, the user program step instruction words read from the magnetic card and transferred to the data register 518.

Output buffer 503 operates in conjunction with a tri-state buffer of the calculator system's arithmetic chip to enable the transmission of data along the EXT line from the card reader/writer chip to the system's keyboard register. The contents of the keyboard register (not shown) is continuously being circulated by shifting the contents through the tri-state buffer and back to the keyboard register. By lowering the impedance of output buffer 503 (lower than that of tri-state buffer on the arithmetic chip), the data being transmitted to the arithmetic chip on the EXT line may be written over the data being circulated in the keyboard register. This method of transmitting data is advantageous because it eliminates the need for synchronizing data transmission.

Figure 5:
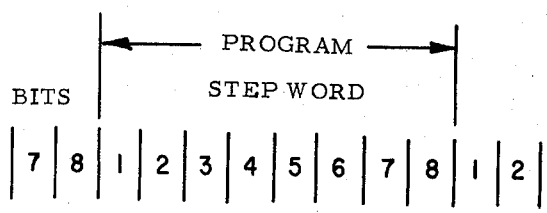
FIGS. 5a–5j are diagrams illustrative of the input signals received from the card reader mechanism coil and the logic signals generated on the chip in response thereto.
Figure 5:
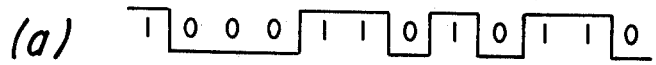
Figure 5:
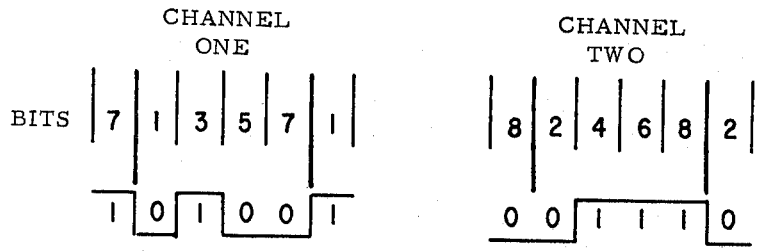
Figure 5:
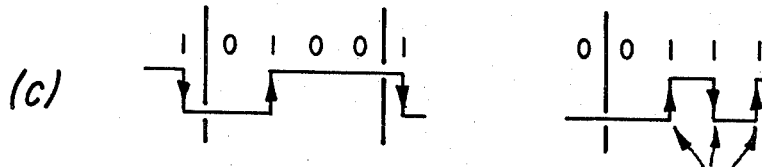
Figure 5:
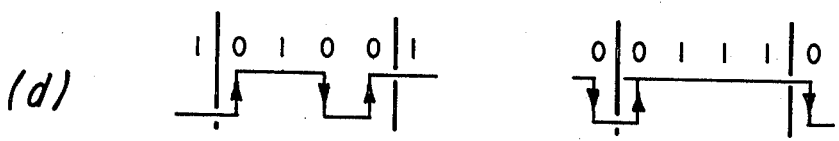
Figure 5:
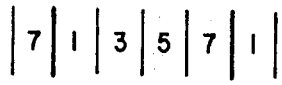
Figure 5:
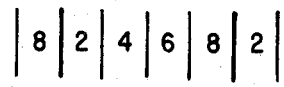

The stored information, on the magnetic card produces signals on lines 525 and 527 as the magnetic card moves. For example, the signals produced with the exemplary program step word of FIG. 5a are shown in FIG. 53. The corresponding low level signals produced on lines 526 and 528 are shown in FIG. 5. These low level signals, consisting of "up" negative to positive transistion and "down" positive to negative transitions, are amplified by four individual operational amplifiers 529 and, as amplified, are supplied to threshold detectors or Schmitt trigger circuits 530. These low level signals consist of a 5 mv variation from a $V_{batt}$ (−4VDC) bias applied to the reader/writer coils 10. The amplitude of these low level signals is exaggerated in FIGS. 5e and 5f for sake of clarity. Threshold detectors 530 operate to pass a pulse of uniform magnitude when the predetermined threshold is reached and operate to filter noise from the card reader so as to prevent errors in the data. Threshold detectors 530 also serve to separate the "up" and "down" transitions (e.g., the positive and negative variations on the $V_{batt}$ bias) so that, for example, line 531 carries a signal indicating only "up" transitions on the "one" track of channel one, as is shown in FIG. 5g. The signal on line 532 is responsive only to "down" transitions on the "one's" track of channel one as is shown in FIG. 5h. Similar signals are produced on lines 533 and 534 for the zero track of channel one. See FIGS. 5i and 5j. Channel two operates identically to channel one. The signals on lines 531-534, as well as the similar signals on lines 535 for channel two, are supplied to the error detection/correction circuit 517 and are applied to a respective one of two flip-flops or data latches 536, one flip-flop per channel. At the outputs of these data latches 536, the two channels of information which are being read from the magnetic card are converted to standard binary form with bits 1, 3, 5, 7 appearing sequentially on line 537 and bits 2, 4, 6, 8 appearing sequentially on line 538. These data bits on lines 537 and 538 are applied to the eight bit shift register 539 in the appropriate bit positions. When the shift register 539 is completely filled with all eight bit user program step instruction word has been read from the magnetic card and decoded.

As had been described above, the signals on lines 531-535 are also supplied to the error detection/correction circuit 517. The signals on lines 531-534 completely define the four bits of data on channel one. correspondingly, lines 535 carry signals determining the four bits of data on channel two. Operation of the error detection/correction circuit 517 is described in U.S. patent application Ser. No. 622,288 filed Oct. 10, 1975.

FIGS. 6a-6d are representations of input voltages and voltages appearing at selected nodes in the operational amplifier/level detector circuit of FIG. 4. These voltages representations are not to scale; however, the input voltage representations are less exaggerated that the input voltage representations of FIGS. 5e and 5f. As aforementioned, the input pulses are of approximately 5 mv amplitude on a bias of approximately −4 volts D.C.

Figure 6:
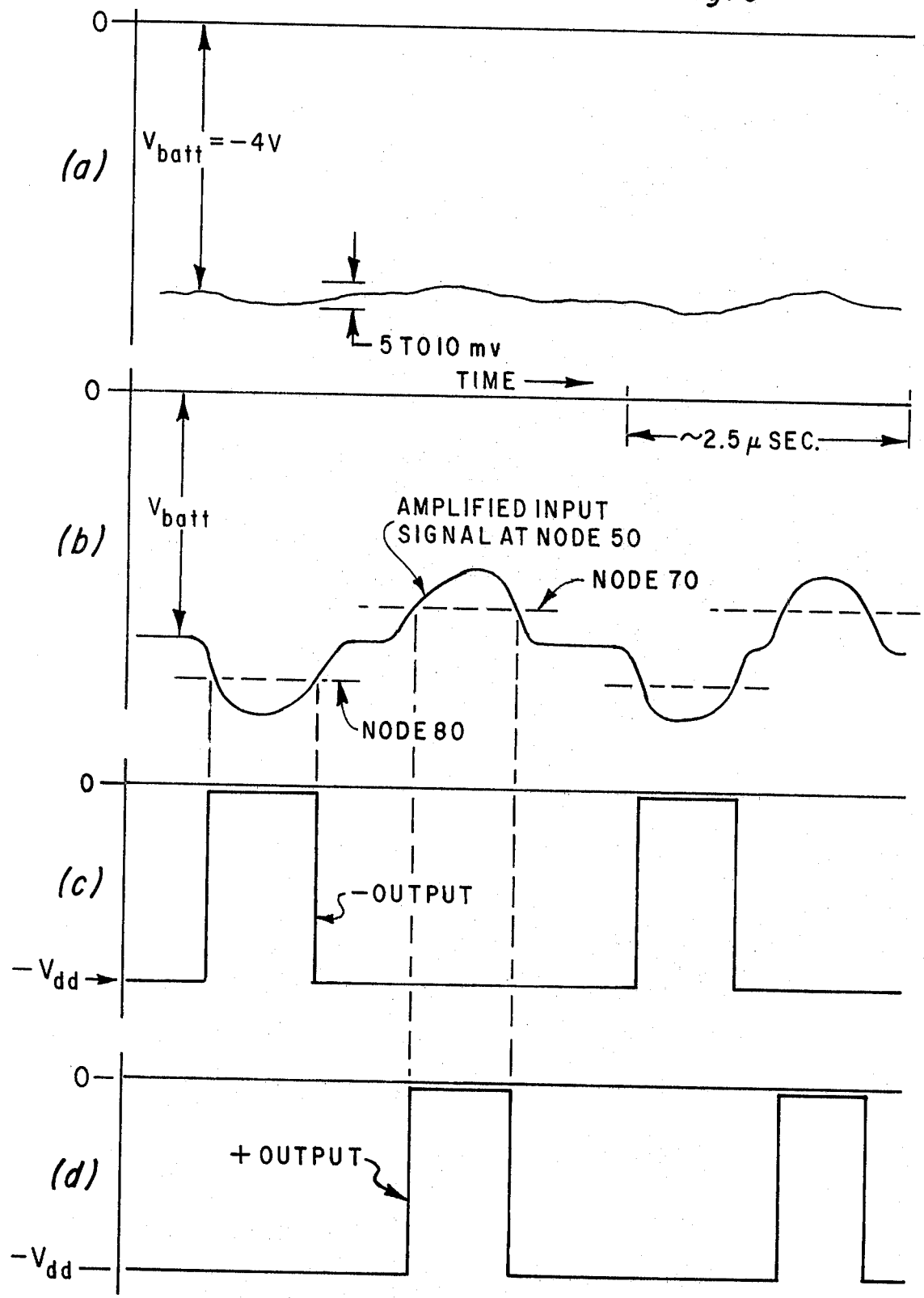
FIGS. 6a–d depict an input signal received at the amplifier, an output signal from the amplifier at node 50 thereof and output signals from the latch circuits generated in response to the input signals.

Referring now to FIG. 4, the operational amplifier/level detector circuit for converting the low level signal (FIGS. 5e, 5f and 6a) from one of the reader/writer coils 10 to a set of positive and negative signals as seen in FIGS. 6c and 6d is illustrated. This circuit is only a small part of the circuitry which would be on a MOS/LSI semiconductor chip; for instance, the magnetic card reader/writer chip of FIGS. 3a-3b preferably would have implemented thereon the circuits of FIG. 4 in addition to the logic devices depicted in FIGS. 3a-3b. Preferably, there is one circuit of FIG. 4 for each reader/writer coil 10 utilized in the calculator system.

Figure 7A:
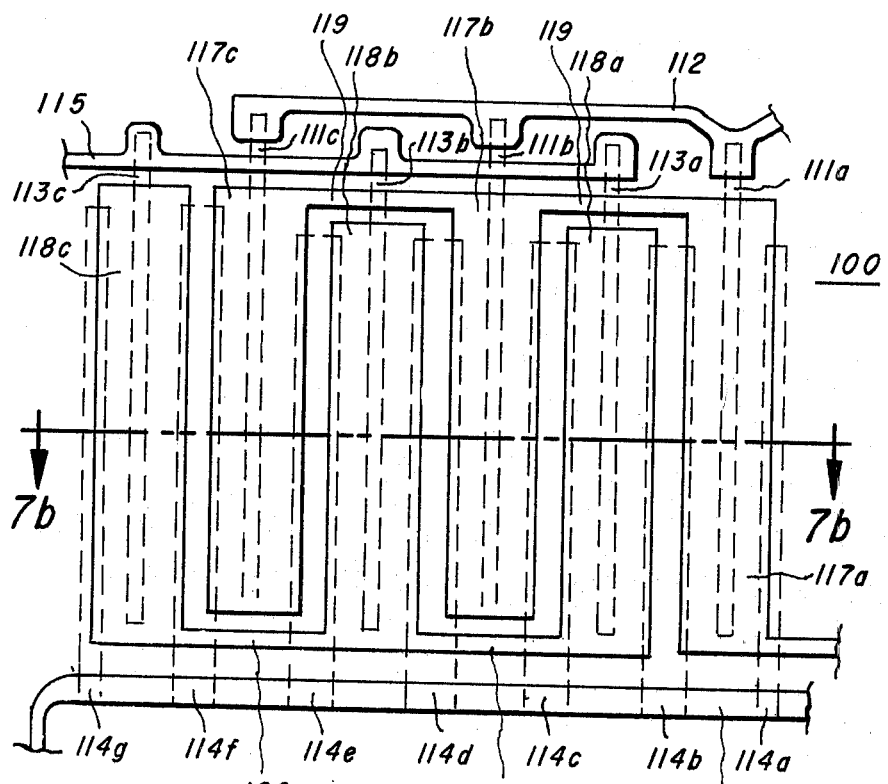
FIGS. 7a–7b are plan and side sectional views through the interdigitated transistor pair of this invention.
Figure 7B:
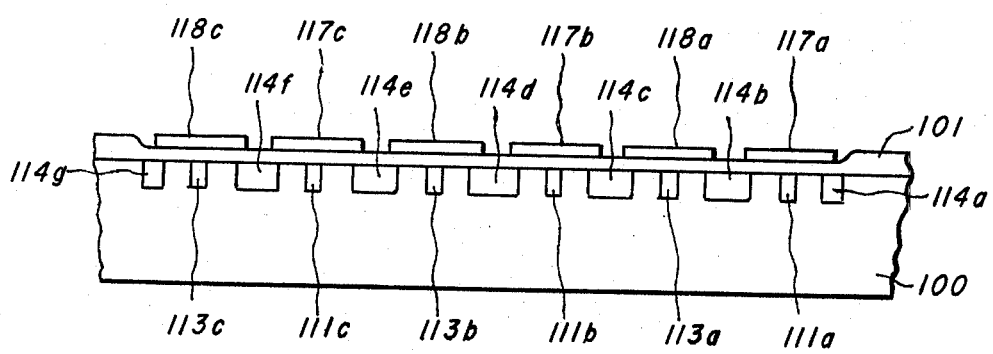

In FIG. 4, the reader/writer coil 10 is shown connected to an input terminal 10' for operational amplifier 529, and this terminal is in turn connected to the gate of a field effect transistor (FET) 11 which is matched with a FET 12, as a differential pair. The sources electrodes (sources) of FET's 11 and 12 are connected at a common point 13 and through a FET 14 to a Vps line 15. The Vps line is grounded (e.g., connected to Vss), only when the card reader is actuated, i.e., when motor 8 (FIG. 2) is energized. The drain electrodes (drains) of FET's 11 and 12 are connected to the Vgg supply line 16 via depletion loads 17 and 18. Vgg is about −17V D.C. for P-channel MOS transistors. The differential pair including FET's 11 and 12 preferably has as low an offset voltage as possible, which this is attained by interdigitating these two FET's as shown in FIGS. 7a and 7b. Interdigitating the input FET's is hereinafter discussed in detail.

The voltage on node 24, which is applied to the gate of FET 12, is generated by a feedback circuit including a capacitor 20 and divider resistors 21 and 22 connected to a $V_{batt}$ supply line 23. This voltage is a function of the operational amplifier output voltage at a node 50 and produces a DC gain of unity and an AC gain of about 200. Resistors 21 and 22 provide a ratio of 200:1 (resistor 21 may be 100 ohms and resistor 22 may be 20K ohms, for example) so 1/200 of the AC output at node 50 appears at node 24 as feedback. The capacitor 20, which preferably has a value of 50 ufd to provide a low-pass filter in the feedback circuit rolling off at 50 to 60 Hz, is typically provided external to the chip because of its relatively large value.

The outputs at the drains of FET's 11 and 12 are applied to the gates of source-follower FET's 25 and 26, the outputs of which are applied to a differential amplifier comprising FET's 27 and 28 and the drains of which are connected to a Vdd supply line 39. Vdd is about −10V D.C. for P-channel MOS FET's. The sources of FET's 25 and 26 are connected via FET's 29 and 30 to the Vps line 15. The gates of all three of FET's 14, 29 and 30 are connected to a node 31. The sources of the FET's 27 and 28 are connected in common to the node 31, FET's 27 and 28 have depletion loads 32 connecting their drains to Vgg supply line 16.

The voltage on the node 31 is controlled by (1) a constant current source formed by a FET 35 connected to Vps, (2) the current flowing through FET's 27 and 28 and, (3) the threshold voltage ($V_t$) of the FET's implemented on the chip. As is known, $V_t$ for FET's can vary between −1.3 to −2.3 volts and thus it was heretofore believed that a low-level amplifier could not be implemented in either P-channel or N-channel FET chips (e.g., single channel type FET chips).

Using the common mode feedback arrangement comprising FET's 14, 27-30, desensitizes amplifier 529 to wide variations in $V_t$ but yet permits amplifier 529 to amplify a 5-mV input signal to a 1-volt logic swing.

The gate of FET 35 is connected to a divider made up of two devices including a depletion load device 36 and an FET 37 having its gate connected to its drain. The device 36 and FET 37 are connected between Vps and Vdd lines 15 and 39 and result in a constant voltage on the node 38 for a given chip, but parametic variations caused by the process used to make the chip are compensated for because the voltage on node 38 varies with different chips to account for changes in $V_t$ on these chips. The node 38 between the device 36 and FET 37 provides the gate voltage for FET 35 as well as seven other source-biasing FET's 40-46. FET 40, for example, merely acts as a resistor for a source follower FET 48, staying at a constant value because of the constant voltage on the node 38.

The output at the drain of FET 27 is connected to the gate of source follower FET 48, the output of which is at a node 50. Node 50 is connected via a capacitor 51 to the drain of FET 11 at the input of the operation amplifier 529, and connected via resistor 22 to node 24. Capacitor 51 is a roll-off capacitor, acting as a low-pass filter, resulting in the AC gain being down 3 dB at 8 to 10 kHz.

Node 50 is also connected as an input to a pair of level detector circuits 52 and 53 in the threshold detector 530 for driving latches 54 and 55, the outputs of which provide "plus" and "minus" outputs 56 and 57, respectively, from threshold detector 530. The voltage on the node 50 is approximately 200 times the AC voltage produced in the coil 10, so it is about 1 to 2 volts AC, still superimposed on V-batt, as seen in FIG. 6(b).

Level detector circuit 52 includes a pair of differential FET's 60 and 61 which have depletion loads 62 connecting their drains to Vgg supply line 16, and which have their sources connected together and through FET 41 to Vps line 15. The gate of transistor 60 is connected to node 50 and the gate of transistor 61 is connected to a node 70. Node 70 is biased between Vps and $V_{batt}$ by voltage divider resistors 71 and 72, which biases circuit 52 to be responsive to positive pulses superimposed on $V_{batt}$ at node 50. The outputs at the drains of FET's 60 and 61 are connected to the gates of a pair of source follower FET's 64 and 65, and, in turn, the outputs of these FET's are connected as inputs 66 and 67 to latch 54. The voltage on node 70 is dependent upon the voltage divider made up of two resistors 71 and 72 connected between $V_{batt}$ and Vps supply lines 23 and 15. Resistor 72 is large compared to 71, and the level at node 70 is set at slightly less negative than $V_{batt}$, so a positive-going signal as seen in FIG. 3(6) will cause a transistion from FET 60 conducting to FET 61 conducting.

Level detector circuit 53 includes a pair of FET's 74 and 75 which, like the pair of FET's 60 and 61, have depletion loads 76 connecting their drains 51 to Vgg supply line 16, and have their sources connected together and through FET 44 to the Vps supply line 15. The gate of FET 74 is connected to node 50 and the gate of FET 75 is connected to a node 80. Outputs from the two FET's 74 and 75 are connected to gates of source follower FET's 77 and 78. The input to FET 75 is a fixed voltage at node 80 provided by a divider which includes resistors 81 and 82 connected in series between Vdd line supply 39 and $V_{batt}$ line 23. This establishes a level more negative than $V_{batt}$ (which is the steady state voltage at node 50), so a negative-going pulse will be required on node 50 to turn on FET 74. The outputs from FET's 77 and 78 are applied by lines 83 and 84 to inputs of the latch 55.

The voltages established at node 70 for level detector circuit 52 and at node 80 for level detector circuit 53 determine the amplitude of voltage required at the input to the level detector circuits 52 and 53 at node 50 to cause transistor 74 to become conducting on a negative going pulse and to cause transistor 60 to become non-conducting on a positive going pulse. Since the input to latches 54 and 55 are connected via source follower transistors to the drains of the differential paris in level detecting circuits 52 and 53 respectively, the output on lines 56 and 57 are selected from complementary outputs of latches 54 and 55 so that the output latches present a logical zero (e.g., Vss or 0 volts) when either a negative-going pulse or a positive-going pulse of sufficient magnitude is detected by the respective level detecting circuits 52 and 53. The voltage relationships between the input signal at node 50 and the constant voltages seen at nodes 70 and 80 is diagomatically depicted in FIG. 6b. From FIGS. 6b-6d it can be seen when the signal at node 50 attains the voltage of either node 70 or node 80 the respective outputs from latches 54 and 55 switch state as shown in FIGS. 6d and 6c respectively.

Referring now to FIGS. 7a and 7b, there is shown an interdigitated complementary MOS transistor pair. In FIG. 7a, which is a plan view of the device on a semi-conducting substrate 100, the solid lines outline areas of metalization while the dashed lines outline regions of impurities embedded in the surface of semiconductor substrate 100. Preferably these regions form P type semiconductive pockets in an N type or intrinsic semiconductor substrate 100 and are formed using conventional processing. Regions 111a–111c are long rectangular shaped pockets of preferably P type material, which pockets are arranged essentially parallel to each other and are electrically connected in common by metalization layer 112. Regions 113a–113c are also long rectangular pockets of preferably P type material, also arranged essentially parallel to each other and to regions 111a–111c, with which regions 113a–113c are interleaved. Regions 113a–113c are electrically connected in common by metalization layer 115.

Regions 114a–114g are long rectangular shaped pockets of preferably P type material, which regions are arranged essentially parallel to each other and to regions 111a–111c and regions 113a–113c. Regions 114a–114g are interleaved among regions 111a–111c and 113a–113c, a 114 region being disposed between adjacent pairs of 111 and 113 regions. Regions 114a–114g are electrically connected in common by metalization layer 116.

Gate metalization layers 117a–117c, which are electrically connected in common by metalization 119, each overlie most of regions 111a–111c, respectively, and partially overlie the 114 regions interleaved on either side of regions 111a–111c. Similarly, gate metalization layers 118a–118c, which are electrically connected in common by metalization 120, overlie most of regions 113a–113c, respectively, and partially overlie the 114 regions interleaved on either side of regions 113a–113c. Regions 111a–111c form the drain electrode and regions 117a–117c form the gate electrode of a first transistor of the complementary pair; regions 113a–113c form the drain electrode and regions 118a–118c form the gate electrode of the second transistor of the complementary pair. Regions 114a–114g form the source electrodes for the first and second transistors of the complementary pair, the sources being connected in common for the circuit depicted in FIG. 4. It should be evident, however, that the sources could be brought out separately and the drains could be connected in common with the geometry as shown in FIG. 7a, a pocket of semiconductive material being defined as either a drain or a source according to how it is electrically interconnected in a circuit rather than according to its geometry.

Referring now to FIG. 7b, there is shown a cross sectional view through the interdigitated complementary pair of FIG. 7a. The aforementioned regions are depicted here in semiconducting substrate 100 along with a layer of oxide 101, the gate oxide in-way-of gates 117a–117c and 118a–118c of course being thinner than the field oxide. As can be seen, source regions 114b–114f each serve as a source for both transistors of the complementary pair. For example, source region 114b serves as a source for drain region 111a which forms a part of the first transistor of the complementary pair in combination with gate electrode 117a; source region 114b further serves as a source for drain region 113a forming the second transistor of the complementary pair in combination with gate electrode 118a.

This interdigitated complementary pair is relatively immune to the effects of manufacturing tolerances in that both transistors of the complementary pair are of larger area than a typical FET transistor and being interdigitated, as shown, any minor defect affecting only one portion of the chip will more likely have the same effect on both transistors of the complementary pair, thus maintaining a constant electrical characteristic for the overall operation of the complementary pair.

Having described the invention in connection with a specific embodiment thereof, it is to be understood that modification may now suggest itself to those skilled in the art. It is to be understood that this invention is not limited to the specific embodiment disclosed, except as set forth in the appended claims.

What is claimed is:

1. A complementary transistor pair device comprising:
    (a) a semiconductive substrate of semiconductive material selected from intrinsic or one conductivity type semiconductive material;
    (b) a plurality of first semiconductive regions of opposite conductivity type in said substrate and extending to a major surface thereof, said first semiconducting regions forming elongated areas in the surface of semiconductive substrate, the major axes thereof being essentially parallel and said first semiconductive regions being electrically interconnected;
    (c) a plurality of second semiconductive regions of said opposite conductivity type in said substrate, said second semiconductive regions forming elongated areas in the surface of said substrate, the major axes thereof being essentially parallel and said second semiconductive regions being electrically interconnected;
    (d) a plurality of third semiconductive regions of said opposite conductivity type in said substrate, said third semiconductive regions forming elongated areas in the surface of said substrate, the major axes thereof being essentially parallel, said third semiconductive regions being electrically interconnected and interdigitated with said first and second semiconductive regions;
    (e) a plurality of first gate electrodes, each of said first gate electrodes being disposed over a major portion of each of said first semiconductive regions, said first gate electrodes being electrically interconnected; and
    (f) a plurality of second gate electrodes, each of said second gate electrodes being disposed over a major portion of said second semiconducting regions, said second gate electrodes being electrically interconnected.

2. The device according to claim 1, wherein said plurality of electrically interconnected first gate electrodes provide a first gate and wherein said plurality of electrically interconnected second gate electrodes provide a second gate.

3. The device according to claim 2, wherein said first and second gates are further respectively disposed over portions of said semiconductive substrate adjacent to the interdigitated first and second semiconductive regions.

4. The device according to claim 1, further including a layer of insulating material disposed between said substrate and said first and second gate electrodes.

5. The device according to claim 4, wherein said pluralities of first, second and third regions are disposed essentially parallel to each other and wherein a majority of said third regions are disposed in between ones of said first and ones of said second regions.

6. The device according to claim 5, wherein said plurality of electrically interconnected first gate electrodes provide a first gate and wherein said plurality of electrically interconnected second gate electrodes provide a second gate.

7. The device according to claim 6, wherein said first and second gates are further respectively disposed over portions of said semiconductive substrate adjacent to the interdigitated first and second semiconductive regions.

8. The device according to claim 7, wherein the layer of insulating material is provided by gate oxide, wherein an active region of said first gate is defined where said first gate electrodes are disposed over gate oxide between said first and third semiconductive regions, wherein an active region of said second gate is defined wherein said second gate electrodes are disposed over gate oxide between said second and third semiconductive regions and wherein the active regions of said first and second gates are disposed along a major portion of the lengths of said first and second regions, respectively.

9. The device according to claim 5, wherein each of said first regions is disposed adjacent to differing ones of said third regions and wherein each of said second regions is disposed adjacent to differing ones of said third regions.

10. The complementary transistor pair according to claim 4, wherein said first, second and third semiconductive regions are of the P conductivity type.

11. The complementary transistor pair according to claim 10, wherein said third semiconductive regions form the source electrodes for two field effect transistors and wherein said first semiconductive regions from the drain electrode of one of said field effect transistors and wherein said second semiconductive regions form the drain electrode of the other of said field effect transistors.

12. The complementary transistor pair according to claim 10, wherein said third semiconductive regions form the drain electrodes of two field effect transistors and wherein said first semiconductive regions form the source electrode of one of said field effect transistors and wherein said second semiconductive regions form the source electrode of the other of said field effect transistors.

13. The complementary pair semiconductive device comprising:
    (a) a semiconductive substrate of semiconductive material selected from intrinsic or one conductivity type semiconductive material;
    (b) a plurality of semiconductive regions in said substrate, each of said semiconductive regions forming an elongated area of opposite conductivity type in the surface of said semiconductive substrate, the major axes thereof being essentially parallel;
    (c) first means for interconnecting every other one of said semiconductive regions to form a first electrode of said complementary pair semiconductive device;
    (d) second means for interconnecting alternating ones of said semiconductive regions not interconnected by said first means for forming a second electrode of said complementary pair semiconductor device;
    (e) third means for interconnecting semiconductive regions not interconnected by either of said first or second means for forming a third electrode of said complementary pair semiconductive device; and (f) gate means for forming a first gate associated with said semiconductive regions interconnected by said second means and a second gate associated with said semiconductive regions interconnected by said third means.

14. The complementary pair semiconductive device according to claim 13, wherein said first electrode is a common source electrode for a complementary field effect transistor pair and wherein said second and third electrodes are the drain electrodes of said complementary field effect transistor pair.

15. The complementary pair semiconductor device according to claim 13, wherein said first electrode is a common drain electrode for a complementary field effect transistor pair and wherein said second and third electrodes are the source electrodes of said complementary field effect transistor pair.

* * * * *